United States Patent
Park et al.

(10) Patent No.: US 11,661,649 B2
(45) Date of Patent: May 30, 2023

(54) COMPONENT FOR FUEL INJECTOR AND METHOD FOR COATING THE SAME

(71) Applicant: HYUNDAI KEFICO CORPORATION, Gyeonggi-do (KR)

(72) Inventors: Han Su Park, Suwon (KR); Heon Joon Park, Uiwang (KR); Sung Chul Cha, Seoul (KR)

(73) Assignee: Hyundai Kefico Corporation, Gyeonggi-Do (KR)

( * ) Notice: Subject to any disclaimer, the term of this patent is extended or adjusted under 35 U.S.C. 154(b) by 75 days.

(21) Appl. No.: 17/129,358

(22) Filed: Dec. 21, 2020

(65) Prior Publication Data

US 2021/0190024 A1 Jun. 24, 2021

(30) Foreign Application Priority Data

Dec. 23, 2019 (KR) .......................... 10-2019-0172907

(51) Int. Cl.
| | |
|---|---|
| *F02M 61/16* | (2006.01) |
| *C23C 14/06* | (2006.01) |
| *C23C 14/35* | (2006.01) |
| *C23C 14/56* | (2006.01) |

(Continued)

(52) U.S. Cl.
CPC ...... *C23C 14/0664* (2013.01); *C23C 14/0688* (2013.01); *C23C 14/35* (2013.01); *C23C 14/352* (2013.01); *C23C 14/56* (2013.01); *C23C 28/04* (2013.01); *C23C 28/42* (2013.01); *F02M 61/166* (2013.01); *F02M 61/168* (2013.01); *F02M 2200/02* (2013.01); *F02M 2200/9038* (2013.01)

(58) Field of Classification Search
CPC .......................... C23C 14/0664; C23C 28/42
USPC ......................................................... 428/697
See application file for complete search history.

(56) References Cited

U.S. PATENT DOCUMENTS

| | | | | |
|---|---|---|---|---|
| 2003/0089343 | A1* | 5/2003 | Yamaguchi | C23C 28/00 123/495 |
| 2014/0373751 | A1* | 12/2014 | Schuh | C23C 14/0635 204/192.15 |
| 2015/0086794 | A1 | 3/2015 | Akita et al. | |

(Continued)

FOREIGN PATENT DOCUMENTS

| | | | |
|---|---|---|---|
| CA | 2680495 | * | 4/2003 |
| CN | 104349894 A | | 2/2015 |

(Continued)

OTHER PUBLICATIONS

W. Qi-min et al., "Progress of High Power Impulse Magnetron Sputtering for Deposition of Hard Coatings", Journal of Guangdong University of Technology, 30(4), Dec. 2013, English Abstract Provided.

*Primary Examiner* — David Sample
(74) *Attorney, Agent, or Firm* — Fox Rothschild LLP (57) ABSTRACT

Disclosed are a component for a fuel injector and a method for coating the same. The component for the fuel injector may include a base material, a bonding layer laminated on the base material, a support layer laminated on the outer surface of the bonding layer, and an NbSiCN functional layer including an NbCN layer and an SiCN layer and alternately laminated on the outer surface of the support layer, thereby reducing friction, high hardness, shock resistance, heat resistance, and durability of the component for the fuel injector.

7 Claims, 3 Drawing Sheets

(51) Int. Cl.
   *C23C 28/00* (2006.01)
   *C23C 28/04* (2006.01)

(56) References Cited

U.S. PATENT DOCUMENTS

2015/0368787 A1* 12/2015 Yamamoto .............. C23C 28/42
                                                        428/448
2019/0022763 A1*  1/2019 Tanaka .................... B23F 21/00

FOREIGN PATENT DOCUMENTS

| | | |
|---|---|---|
| CN | 107177827 A | 9/2017 |
| CN | 107385401 * | 11/2017 |
| JP | 2012121114 A | 6/2012 |
| KR | 1020150023312 A | 3/2015 |
| KR | 10-2019-0000789 A | 1/2019 |
| KR | 1020190000789 A | 1/2019 |

* cited by examiner

COMPONENT FOR FUEL INJECTOR AND METHOD FOR COATING THE SAME

CROSS-REFERENCE(S) TO RELATED APPLICATIONS

This application claims the benefit of Korean Patent Application No. 10-2019-0172907 filed on Dec. 23, 2019, the entire contents of which is incorporated herein by reference for all purposes as if fully set forth herein.

TECHNICAL FIELD

The present invention relates to a component for a fuel injector and a method for coating the same. Particularly, the component for a fuel injector may include a coating material for enhancing the reduction in friction resistance, coating hardness, and durability lifespan.

BACKGROUND

A fuel injector for a vehicle is one of the core components serving to timely supply fuel to an engine according to the stroke of the engine. In this regard, among components of the fuel injector, a ball and a valve sheet, particularly, as a sliding member, are miniaturized, but exposed to greater and repetitive load and stress, thereby causing a phenomenon in which lifespan is rapidly lowered by thermal shock, abrasion, and the like.

In the related art, for improving the abrasion-resistance of the slide component, a method for forming a bonding layer on a base material of the sliding component, forming a support layer on the surface of the bonding layer, and forming a functional layer on the surface of the support layer has been provided, thereby improving the abrasion resistance and heat resistance of the sliding member. Further, a method of applying a Mo-based material as a coating material to a sliding member has been introduced. For example, an ion plating type physical deposition method may forms a Mo film by depositing Mo ions evaporated and by using a high-energy beam on a base material as a deposition method of the Mo-based material.

However, in this deposition method, particles in a non-ion state having a relatively large diameter are deposited on the base material together in addition to the Mo ion particles evaporated from an Mo target by the high-energy beam. As such, the non-uniformity of the deposited particles may be caused thereby aggravating the illumination of the coating film and aggravating the bonding force to the base material, and the durability of the coating film may be remarkably reduced as a whole.

SUMMARY

In one preferred aspect, provided is a component for a fuel injector which may enhance the reduction in the friction, the high hardness, the shock resistance, the heat resistance, and the durability.

In one preferred aspect, provided is a method for coating the component for the fuel injector such that for example, precise coating to a necessary portion of a very small component may be provided.

In an aspect, provided is a component for a fuel injector, which may include a base material, a bonding layer on the base material, a support layer on the bonding layer, and an NbSiCN functional layer suitably including an NbCN layer and an SiCN layer, which may be alternately positioned on the outer surface of the support layer.

In certain preferred aspects, the bonding layer may be laminated on the base material.

In additional certain preferred aspects, the support layer may be laminated on the bonding layer, e.g. laminated on an outer surface of the bonding layer.

In additional certain preferred aspects, an NbCN layer and an SiCN layer may be alternately laminated on the outer surface of the support layer.

In certain aspects, the NbSiCN functional layer suitably may be formed by injecting a hydrocarbon gas while depositing a first composition including Si.

In certain aspects, the NbSiCN functional layer suitably may be formed by injecting a hydrocarbon gas while depositing a second composition including niobium.

In certain aspects, the NbSiCN functional layer suitably may be formed by injecting a hydrocarbon gas while alternately depositing a first composition including Si and a second composition including niobium.

In certain aspects, the NbSiCN functional layer suitably may be formed by a high power impulse magnetron sputtering method.

In an aspect, provided is a method for coating a component for a fuel injector. The method may include mounting a base material in a chamber, forming a bonding layer on the outer circumferential surface of the base material, forming a support layer on the outer surface of the bonding layer, and forming a functional layer on the outer surface of the support layer.

Preferably, the bonding layer may be laminated on the outer circumferential surface of the base material, the support layer may be laminated on the outer surface of the bonding layer, and the functional layer may be laminated on the outer surface of the support layer. Preferably, the functional layer may include an NbSiCN functional layer formed the outer surface of the support layer.

The NbSiCN functional layer suitably may be formed by using a first composition including Si and a hydrocarbon gas.

The NbSiCN functional layer suitably may be formed by using a second composition including niobium and a hydrocarbon gas.

The NbSiCN functional layer suitably may be formed by alternately depositing an SiCN layer and an NbCN layer using a first composition (a first target material) including Si and a second composition (a second target material) including niobium.

The NbSiCN functional layer may be formed by a high power impulse magnetron sputtering method.

The method for coating the component for the fuel injector may further include: after the mounting of the base material in the chamber, generating a vacuum state in inner atmosphere of the chamber, generating plasma by injecting an Ar gas into the reaction chamber and increasing the temperature of the chamber so as to generate Ar ions, and treating the surface of the base material by colliding the Ar ions with the surface of the base material.

Further provided is a fuel injector including the component as described herein, or the component manufactured by the method described herein.

According to various exemplary embodiments of the present invention, the component for the fuel injector and the method for coating the same may enhance the reduction in friction, high hardness, shock resistance, heat resistance, and durability of the component for the fuel injector. As such, desired durability, the heat resistance, and the shock resistance may be obtained with only coating having a thin thickness.

Vehicles are also provided that comprise a component as described herein and/or a fuel injector as described herein. Vehicles include for example ground vehicles such as automobiles, trucks and motorcycles; boats; airplanes; and the like.

Other aspects of the invention are disclosed infra.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Hereinafter, various exemplary embodiments of the present invention will be described in detail with reference to the accompanying drawings.

Various changes and various exemplary embodiments may be made in the present invention, such that specific exemplary embodiments are illustrated in the drawings and described in detail in the specification. It should be understood, however, that it is not intended to limit the present invention to the particular disclosed forms, but includes all modifications, equivalents, and alternatives falling within the sprit and technical scope of the present invention.

In describing the present invention, the terms "first," "second," and the like may be used to illustrate various components, but the components should not be limited by the terms. The terms are used only to differentiate one element from another. For example, a first component may be referred to as a second component, and similarly, the second component may also be referred to as the first component without departing from the scope of the present invention.

The terms "and/or" may include a combination of a plurality of related listed items or any of a plurality of related listed items.

When a component is referred to as being "connected" or "coupled" to another component, it may be directly connected or coupled to another component, but it may be understood that other components may be present therebetween. On the other hand, when a component is referred to as being "directly connected" or "directly coupled" to another component, it may be understood that there are no other components therebetween.

The terminology used herein is merely for the purpose of describing particular embodiments, and is not intended to limit the present invention. The singular forms used herein may include plural forms unless the phrases clearly indicate the opposite.

In the present application, it may be understood that the term "comprising", "having", or the like specifies the presence of the characteristic, integer, step, operation, component, part, or a combination thereof described in the specification, and does not exclude the presence or addition possibility of one or more other characteristics, integers, steps, operations, components, parts or combinations thereof in advance.

Unless defined otherwise, all terms including technical terms and scientific terms used herein have the same meaning as commonly understood by those skilled in the art to which the present invention pertains. The terms defined in the dictionary commonly used may be interpreted as having a meaning consistent with the meaning in the context of the related technology, and may not be interpreted as an ideal or very formal sense unless clearly defined in the present application.

Unless otherwise indicated, all numbers, values, and/or expressions referring to quantities of ingredients, reaction conditions, polymer compositions, and formulations used herein are to be understood as modified in all instances by the term "about" as such numbers are inherently approximations that are reflective of, among other things, the various uncertainties of measurement encountered in obtaining such values.

Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In the present specification, when a range is described for a variable, it will be understood that the variable includes all values including the end points described within the stated range. For example, the range of "5 to 10" will be understood to include any subranges, such as 6 to 10, 7 to 10, 6 to 9, 7 to 9, and the like, as well as individual values of 5, 6, 7, 8, 9 and 10, and will also be understood to include any value between valid integers within the stated range, such as 5.5, 6.5, 7.5, 5.5 to 8.5, 6.5 to 9, and the like. Also, for example, the range of "10% to 30%" will be understood to include subranges, such as 10% to 15%, 12% to 18%, 20% to 30%, etc., as well as all integers including values of 10%, 11%, 12%, 13% and the like up to 30%, and will also be understood to include any value between valid integers within the stated range, such as 10.5%, 15.5%, 25.5%, and the like.

Further, the following exemplary embodiment is provided to explain the present invention more completely to those skilled in the art, and the shape, size, and the like of the elements in the figures may be exaggerated for a clearer explanation.

Figure 1:
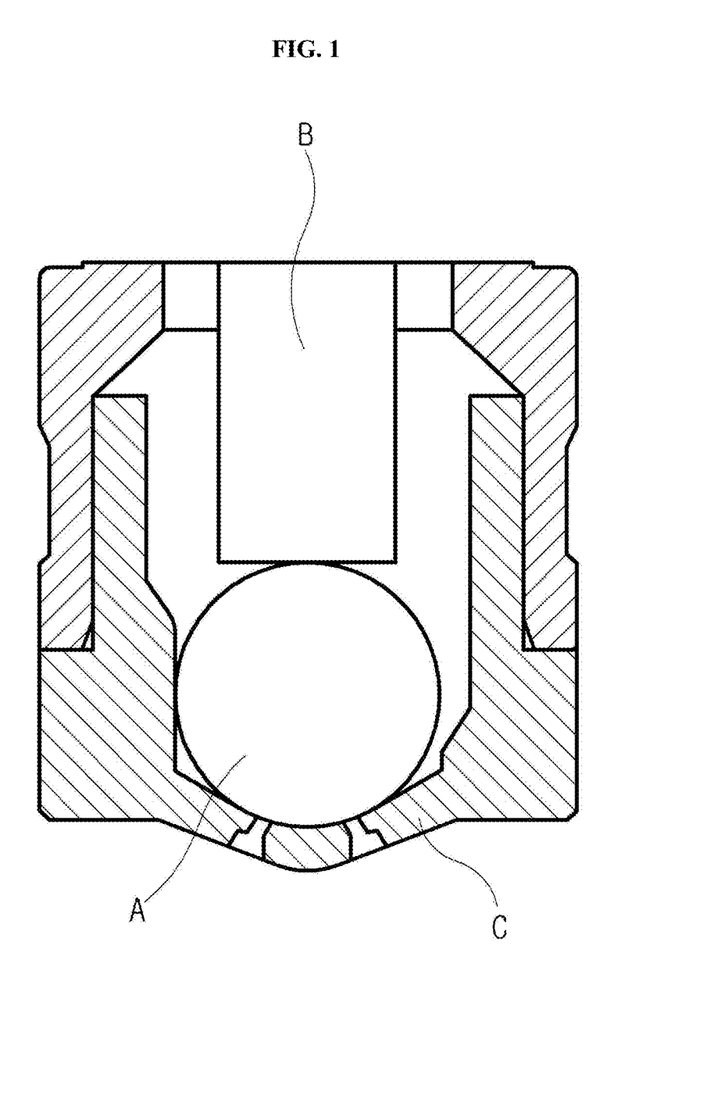
FIG. 1 shows a partially enlarged diagram of an exemplary fuel injector having an exemplary component for an exemplary fuel injector according to an exemplary embodiment of the present invention.

FIG. 1 shows a partially enlarged diagram of an exemplary fuel injector having an exemplary component according to an exemplary embodiment of the present invention.

As shown in FIG. 1, a fuel injector may include a housing accommodating a needle therein, a valve sheet C formed on the lower end of the housing, and a ball A disposed between the valve sheet C and the needle B. The valve sheet C has a valve sheet surface on which the ball A is seated, and the valve sheet C is provided with a nozzle penetrating in the fuel injection direction.

The needle B opens and closes the nozzle formed on the valve sheet C while vertically moving the ball A by the operations of a magnetic coil (not illustrated) and a return spring (not illustrated).

FIG. 1 also shows the ball A having a spherical shape, but the present invention is not limited thereto, and further, valve bodies having various shapes are applicable without restriction and all of these will be regarded as falling within the scope of the present invention. For convenience, hereinafter, the present invention will be described based on an exemplary embodiment about the ball A having the spherical shape.

Since the fuel injector, particularly, a direct injection type fuel injector directly injects fuel into a cylinder, the ball A and the valve sheet C are exposed to the high-temperature and high-pressure state, and a phenomenon such as a nozzle clogging due to a combustion by-product such as carbon monoxide or scoot is highly likely to be caused.

As described above, the ball A and the valve sheet C are exposed in the high-temperature and high-pressure state, and large friction resistance is generated due to the combustion by-product, thereby such that the ball A may be easily damaged. According to an exemplary embodiment of the present invention, a coating material having a multi-layer structure may be laminated on a base material 100 of the ball A and the valve sheet C, thereby decreasing the friction resistance, increasing the durability, and enhancing the heat resistance.

Figure 2:
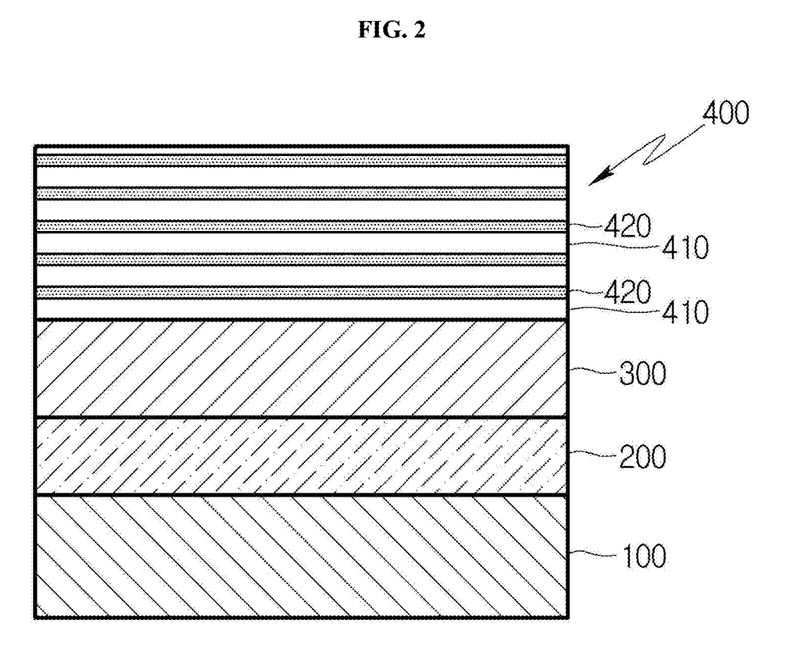
FIG. 2 shows the cross section of an exemplary component for the fuel injector on which an exemplary coating material deposited according to an exemplary embodiment of the present invention is laminated.
Figure 3:
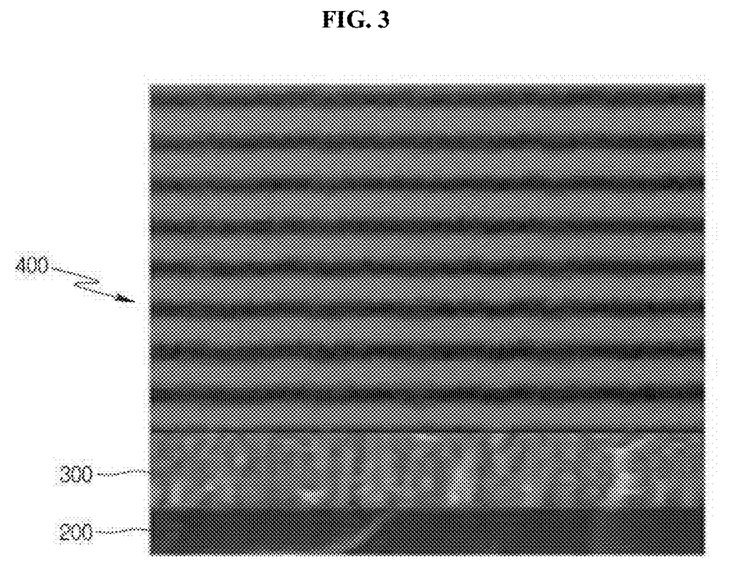
FIG. 3 shows a scanning electron microscope (SEM) photograph of an exemplary coating material deposited according to an exemplary embodiment of the present invention.

FIG. 2 shows the cross section of an exemplary component for the fuel injector on which an exemplary coating material deposited according to an exemplary embodiment of the present invention is laminated, and FIG. 3 shows an electron microscope (SEM) photograph of the coating material deposited according to an exemplary embodiment of the present invention.

As shown in FIGS. 2 and 3, the component for the fuel injector according to an exemplary embodiment of the present invention may include the base material 100, a bonding layer 200, a support layer 300, and an NbSiCN functional layer 400.

The base material 100 may have the bonding layer 200, the support layer 300, and the NbSiCN functional layer 400 laminated thereon.

The base material 100 may be formed in a spherical shape to be used for the injector ball, but the present invention is not limited thereto, and may include all of the base materials formed in various shapes to be applicable to various components used in the injector valve sheet and a high-pressure pump.

The bonding layer 200 may be laminated on the base material 100, and the support layer 300 may be laminated on the outer surface of the bonding layer 200.

Preferably, Cr component (e.g., elemental Cr) may be included in the bonding layer 200, and CrN compound may be included of the support layer 300, but the present invention is not limited thereto. For example, Mo component (e.g., elemental Mo) may be included in the bonding layer 200, and MoN compound may be included in the support layer 300.

The bonding layer 200 and the support layer 300 may be laminated in a physical deposition method, preferably, a physical vapor deposition (PVD).

Figure 4:
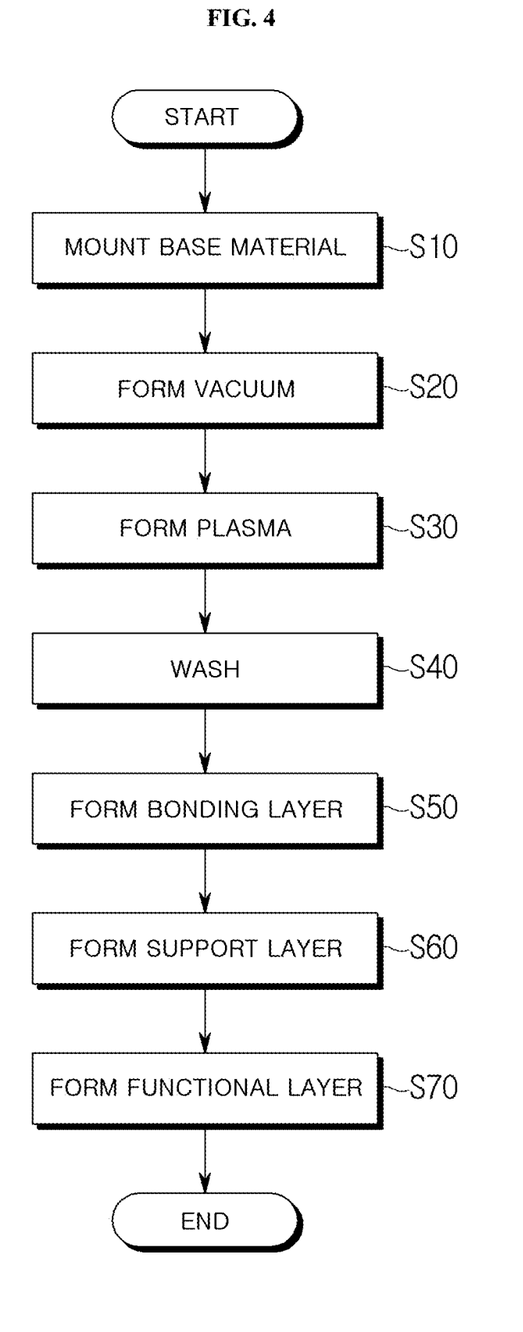
FIG. 4 shows an exemplary method for coating the component for the fuel injector according to an exemplary embodiment of the present invention.

Detailed steps of laminating the bonding layer 200, the support layer 300, and the NbSiCN functional layer 400 will be described later in FIG. 4.

The bonding layer 200 may bond the base material 100 and the support layer 300, may be formed in the thickness of a range of about 0.01 to 0.5 µm, or particularly of about 0.05 µm, but is not limited thereto.

When the thickness of the bonding layer 200 is less than about 0.01 µm, there may occur a problem of lowering the bonding force, thereby lowering the durability, and when the thickness thereof is greater than about 0.5 µm, there may occur a problem of taking about 5 hours or greater to coat, and as there occurs a problem of losing the hardness balance by a thick film within the coasting material, there may occur a problem of lowering the durability (lost by about 25% or greater of the thickness).

The support layer 300 may support the bonding layer 200 and the NbSiCN functional layer 400, and may be formed in the thickness of a range of about 0.1 to 5 µm, or particularly of about, 0.2 µm, but is not limited thereto.

When the thickness of the support layer 300 is less than about 0.1 µm, the interlayer hardness balance may be lost by the shortage of the thickness of the support layer, and there are a problem of lowering the durability (lost by about 20% or greater of the thickness) due to the loss of the interlayer hardness balance, a problem of locally losing the thickness, and a problem of causing abrasion mark (abrasion initiation point activity). Further, when the thickness of the support layer 300 is greater than about 5 µm, there may occur a problem of increasing the coating time (taking about 5 hours or greater) and a problem in that a columnar structure (brittle structure) may be formed by adversely affecting the lamination of the NbSiCN functional layer 400, thereby increasing the residual stress in the layer.

The NbSiCN functional layer 400 may be laminated on the outer surface of the support layer 300, and may serve as a functional layer having the low friction, the abrasion resistance, the heat resistance, and the shock resistance.

The NbSiCN functional layer 400 may be formed in a high power impulse magnetron sputtering method. For example, the NbSiCN functional layer 400 may be formed by alternately depositing a target material (Si or SiC) containing Si and a target material containing niobium (Nb) and injecting hydrocarbon ($C_xH_y$) gas and nitrogen ($N_2$) as a process gas.

Therefore, the NbSiCN functional layer 400 may be formed on the outer surface of the support layer 300 by alternately laminating an SiCN layer 410 and an NbCN layer 420.

The thickness of the NbSiCN functional layer 400 may be of about 0.1 to 10 µm, or particularly of about 0.8 µm, but is not limited thereto.

When the thickness of the NbSiCN functional layer 400 is less than about 0.1 µm, there may occur a problem of lowering the durability due to the increase in the abrasion and the increase in a friction coefficient due to the shortage of the thickness of the functional layer. When the thickness thereof is greater than about 10 µm, there may occur a problem of increasing the coating time (taking about 5 hours or greater) and increasing the cost, and a problem of increasing the residual stress in the layer.

In an aspect, provided is a method for coating the component for the fuel injector according to the present invention will be described step by step with reference to FIG. 4.

The method for coating the component for the fuel injector may include mounting the base material (S10) in a chamber, forming vacuum state (S20) inside the chamber, forming plasma (S30), treating (S40), forming the bonding layer (S50), forming the support layer (S60), and forming the functional layer (S70).

The base material may be mounted (S10). The base material 100 may be mounted using a fixture (not illustrated) for mounting the base material 100 (S10). In particular, the base material 100 may be fixed by applying an attractive force by the magnetic field to the base material 100 made of a metallic material using the fixture provided with a magnet.

The vacuum state may be formed (S20) in the chamber (e.g., reaction chamber) where the base material 100 is mounted. For example, the inner atmosphere of the reaction chamber in the vacuum state may be maintained in the vacuum state (S20).

The plasma (S30) may supply an Ar gas as a process gas, and a plasma state where the Ar ions are formed by increasing the temperature may be using a constant-temperature device (S30).

Preferably, the plasma (S30) may be formed inside of the reaction chamber at a temperature of about 80° C. using the constant-temperature device.

Then, a bias voltage to a bias electrode may be applied (S40), and the surface of the base material may be treated or washed by accelerating the Ar ions to collide with the surface of the base material 100 (S40).

As such, the bonding force between the coating material and the base material may be increased by preferentially performing an etching process for removing an oxide layer and impurities naturally formed on the surface of the base material 100.

Further, the bias voltage may be maintained in a range of about 200 to 400 V. When the bias voltage is less than about 200 V, the acceleration voltage of the Ar ions is decreased to decrease the hardness of the coating material, and when the bias voltage is greater than about 400 V, there may occur a problem of lowering the adhesion due to the non-uniformity of the lattice arrangement.

After treating the base material with the Ar ions (S40), the forming of the bonding layer (S50), which forms the bonding layer 200 by laminating Cr ions on the surface of the base material in the physical deposition method, preferably, the PVD method, may be performed.

Preferably, the bonding layer (S50) may be formed by the sputtering method. For example, a thin film may be formed on the surface of the base material 100 by the ionized Cr by injecting an inert gas in the vacuum state and applying a minus voltage to the Cr (target) to be discharged.

Alternatively, the forming of the bonding layer (S50) may also form the bonding layer using Mo ions.

Preferably, the support layer (S60) may be formed. The supporting layer 300 may be laminated on the outer surface of the bonding layer 200. Preferably, the supporting layer may be formed by the physical deposition method, preferably, the physical vapor deposition (PVD) method.

The support layer may be formed (S60) particularly as CrN particles are formed by reacting the Cr ions generated in the sputtering method and the N ions separated from the nitrogen ($N_2$) gas injected as an activated gas. The support layer 300 may be formed by coating the CrN particles on the outer surface of the bonding layer 200.

Alternatively, the support layer (S60) may be formed by reacting the Mo ions with the N to deposit MoN particles.

The functional layer may be formed (S70), and preferably the functional layer 400 may include an NbSiCN functional layer 400. The functional layer may be laminated on the outer surface of the support layer 300 by the high power impulse magnetron sputtering (HiPIMS) method.

Preferably, by using the high power impulse magnetron sputtering, only the short pulse of several kilowatts among the applied powers upon coating may be used for a coating target. As such, it is possible to increase the content of the target ions by generating the high plasma density, such that the interlayer coupling force with the base material may be substantially improved.

The functional layer (S70) may be formed by the process in the temperature condition at a temperature of about 80° C. or greater and about 500° C. or less, or particularly of about 200° C. When the process temperature is less than about 80° C., there occurs a problem of reducing the bonding force of the functional layer and reducing the durability due to the shortage of the thickness, and there is a problem of increasing the time required for the process. On the other hand, when the process temperature is greater than about 500° C., there may occur the possibility of the inner stress and deformation due to the latent heat of the coating layer.

The forming of the functional layer (S70) may include silicon (Si), silicon carbide (SiC), or niobium (Nb) as the target material. When silicon (Si) or silicon carbide (SiC) is used as the target material, an SiCN layer may be formed, and when niobium (Nb) is used as the target material, an NbCN layer may be formed.

Particularly, the functional layer 400 may be formed (S70) and the functional layer 410 may include the NbSiCN functional layer 400 including a plurality of layers by alternatively depositing the SiCN layer 410 and the NbCN layer 420 by alternately using the target material (Si or SiC) containing Si and the target material containing niobium (Nb).

The functional layer may be formed (S70) by generating the high power impulse which has the power supply of about 500 Hz, the pulse width of about 100 ms, and the average power of about 100 W or greater and about 300 W or less (the peak current of about 0.2 A and the peak voltage of about 652 V).

When the average power is less than about 100 W, there may occur a problem of reducing the bonding force of the functional, and reducing the durability due to the shortage of the thickness, and there is a problem of increasing the time required for the process. On the other hand, when the average power is greater than about 300 W, the fault such as bubble may occur on the surface of the functional layer, and the residual stress within the functional layer may be increased.

The NbSiCN functional layer 400 may be formed by injecting the hydrocarbon ($C_xH_y$) gas and the Ar gas as the reaction gas (process gas). Preferably, methane ($CH_4$) or ethane ($C_2H_6$) may be used a hydrocarbon gas, but is not limited thereto.

EXAMPLE

Hereinafter, the durability evaluation comparison results and physical property evaluation comparison results for an Example manufactured by applying the coating method according to the present invention, and a Comparative Example manufactured according to the related art will be described.

Example

First, the base material 100 having a spherical shape was mounted, a plasma state was made by using an Ar gas in the state where the inside of a chamber was vacuumed, and the surface of the base material 100 made of an SUS440C stainless steel was activated by heating the inside of the chamber at a temperature of 80° C., and then the surface of the base material was treated by applying the bias voltage of 300 V such that Ar ions collided with the surface of the base material 100.

Then, the bonding layer 200 having the Cr component was laminated on the surface of the base material in the thickness of 0.05 μm by injecting Cr ions evaporated in the PVD method.

Further, the support layer 300 having the CrN component was coated in the thickness of 0.2 μm by injecting $N_2$, which was the process gas, into the chamber and reacting with the Cr ions evaporated from the Cr target.

Then, the NbSiCN functional layer 400 was formed by injecting the hydrocarbon gas and the Ar gas into the reaction chamber while depositing the target material containing Si and the target material containing niobium in the HiPIMS method.

Comparative Example 1

Unlike the Example, the Comparative Example 1 was performed except forming a coating material on a base material. The base material was made of an SUS440C stainless steel as in the Example.

Comparative Example 2

A Cr bonding layer was formed on the surface of a base material in the PVD method, a CrN support layer was formed on the outer circumferential surface of the Cr bonding layer in the PVD method, and then a tungsten carbide (CW) functional layer was formed in the PVD method.

Comparative Example 3

A coating material having the same thickness was formed on a base material made of an SUS440C stainless steel as in the Example, a Cr bonding layer was formed on the surface of the base material in the PVD method, a CrN support layer was formed on the outer circumferential surface of the Cr bonding layer in the PVD method, and then an SiO-DLC functional layer was formed on the surface of the CrN support layer in a PACVD method.

Durability Performance Evaluation Test

To conduct the durability performance evaluation, a dry-run test was conducted. The corresponding durability test was a test for evaluating the durability of each coating material for a short time, and equally conducted for the Example and Comparative Examples 1 to 3 in the following test condition.

The test was conducted in the conditions where the test gas was air or nitrogen, the supply pressure was 5 bar, and the test temperature was the room temperature, and used a Peak&Hold (PHID, 1.2 A&0.6 A current control method) as a driver stage in which the supply voltage was 14.0 V, the pulse period was 5.0 ms, the pulse width was 2.5 ms, and the operation time was 30 minutes or more.

As the determination reference, whether there was the damage such as peeling of the surface of the coating material was visually confirmed, and the coating thickness was evaluated.

For the coating thickness, the average value of two places of 0° and 180° of the product and the thickness deviation between the coating materials of two places were measured. The thickness was measured by using a kalotester.

TABLE 1

| Items | Example Cr/CrN/ NbSiCN | Comparative Example 1 SUS440C (No coating) | Comparative Example 2 Cr/CrN/WCC | Comparative Example 3 Cr/CrN/ SiO-DLC |
|---|---|---|---|---|
| Thickness (μm) | 1.1 | — | 1.9 | 2.0 |
| Coating process | PVD + HiPIMS | — | PVD | PVD & PACVD |
| Durability performance evaluation result (Dry-run test) | Thickness: 0% loss Visually: no abrasion mark | Large abrasion mark | Thickness: 50% loss Visually: abrasion mark found | Thickness: 27% loss visually: abrasion mark found |

According to Table 1, as the durability performance evaluation test result, it was confirmed in the component for the fuel injector according to the Example that the thickness of the coating material was lost by 0%, and no abrasion mark was found.

On the other hand, it was confirmed in Comparative Example 2 that the thickness of the coating material was lost by 50%, and some abrasion marks were found.

Further, it was confirmed in Comparative Example 3 that the thickness of the coating material was lost by 27%, and some abrasion marks were found.

As a result, as the result of testing the durability performance for the component for the fuel injector, it was confirmed that the Example of the present invention had a very low loss rate of the coating material compared to the Comparative Examples and had the very good durability performance.

Physical Property Evaluation

To evaluate the physical property of the coating material, the physical property evaluation was conducted.

To derive a friction coefficient, a plate on disk test was conducted by using 10 N, 0.1 m/s, 2 km, and SUS440C pin.

To measure hardness, a micro indenter (0.05 N, 0.7 μm indenting depth) was used.

To measure the bonding force, a scratch tester and a Rockwell C tester (HF1: high bonding force, HF5: low bonding force) were used.

TABLE 2

| Items | Example Cr/CrN/ NbSiCN | Comparative Example 1 SUS440C (no coating) | Comparative Example 2 Cr/CrN/WCC | Comparative Example 3 Cr/CrN/ SiO-DLC |
|---|---|---|---|---|
| Hardness (HV) | 4826(47.33 GPa) | 772(7.32 GPa) | 1305(12.35 GPa) | 2173(20.63 GPa) |
| Heat resistance temperature (° C.) | 700 | — | 300 | 400 |
| Illumination Ra(μm) | 0.024 | 0.2 | 0.052 | 0.043 |
| Friction coefficient dry | 0.1 | 0.45 | 0.16 | 0.13 |
| Friction coefficient oil | 0.022 | 0.22 | 0.07 | 0.06 |
| Adhesive force | HF1 52N | — | HF1-2 28N | HF1-2 31N |

As shown in Table 2, it was confirmed in the Example that the hardness value was better than those of the Comparative Examples, and the friction coefficient was measured as a relatively low value, thereby decreasing the friction resistance.

Further, the adhesive force of the coating material in Example was 52 N and evaluated as being better than those of other Comparative Examples, particularly, the adhesive force of 31 N in Comparative Example 3, because the surface illumination in the Example deposited according to the HiPIMS method of the present application may be maintained very low.

As described above, the present invention has been described in detail through the specific exemplary embodiment, but this is to specifically explain the present invention, the present invention is not limited thereto, and it is apparent that the present invention may be modified or improved by those skilled in the art without departing from the technical spirit of the present invention.

All of the simple modifications and changes of the present invention fall within the scope of the present invention and the detailed scope of the present invention will be clarified by the appended claims.

What is claimed is:

1. A component for a fuel injector comprising:
a base material;
a bonding layer on the base material;
a support layer on the bonding layer; and
an NbSiCN functional layer;
wherein the NbSiCN functional layer comprises an SiCN layer and an NbCN layer alternately positioned on the support layer;
wherein the thickness of the NbSiCN functional layer is greater than 0.1 μm and less than 10 μm.

2. The component for the fuel injector of claim 1, wherein the SiCN layer is formed by injecting a hydrocarbon gas while depositing a first composition comprising Si.

3. The component for the fuel injector of claim 1, wherein the NbCN layer is formed by injecting a hydrocarbon gas while depositing a second composition comprising niobium.

4. The component for the fuel injector of claim 1, wherein the NbSiCN functional layer is formed by injecting a hydrocarbon gas while alternately depositing a first composition comprising Si and a second composition comprising niobium.

5. The component for the fuel injector of claim 1, wherein the NbSiCN functional layer is formed by a high power impulse magnetron sputtering method.

6. A fuel injector comprising the component of claim 1.

7. A vehicle comprise the fuel injector of claim 6.

* * * * *